(12) United States Patent
Gandhi et al.

(10) Patent No.: US 11,195,780 B1
(45) Date of Patent: Dec. 7, 2021

(54) STACKED SILICON PACKAGE ASSEMBLY HAVING THERMAL MANAGEMENT USING PHASE CHANGE MATERIAL

(71) Applicant: XILINX, INC., San Jose, CA (US)

(72) Inventors: Jaspreet Singh Gandhi, San Jose, CA (US); Gamal Refai-Ahmed, Santa Clara, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 57 days.

(21) Appl. No.: 16/828,822

(22) Filed: Mar. 24, 2020

(51) Int. Cl.
| | |
|---|---|
| *H01L 31/12* | (2006.01) |
| *H01L 23/427* | (2006.01) |
| *H01L 23/373* | (2006.01) |
| *H01L 25/00* | (2006.01) |
| *H01L 21/56* | (2006.01) |
| *H01L 25/065* | (2006.01) |
| *H01L 23/10* | (2006.01) |

(52) U.S. Cl.
CPC .......... *H01L 23/427* (2013.01); *H01L 21/565* (2013.01); *H01L 23/10* (2013.01); *H01L 23/373* (2013.01); *H01L 25/0657* (2013.01); *H01L 25/50* (2013.01)

(58) Field of Classification Search
CPC .................................................. H01L 45/144
See application file for complete search history.

(56) References Cited

U.S. PATENT DOCUMENTS

| | | | |
|---|---|---|---|
| 8,921,994 B2 | 12/2014 | Higgins, III | |
| 9,245,865 B1* | 1/2016 | Kwon | ...................... H01L 24/83 |
| 9,576,938 B2 | 2/2017 | Hung et al. | |
| 10,269,682 B2* | 4/2019 | Hsieh | ...................... H01L 24/83 |
| 2006/0172466 A1* | 8/2006 | Shiba | .................... H01L 23/585 |
| | | | 438/124 |
| 2014/0183699 A1* | 7/2014 | Dahlstrom | ............ H01L 23/373 |
| | | | 257/537 |
| 2014/0217575 A1* | 8/2014 | Hung | ...................... H01L 23/36 |
| | | | 257/713 |
| 2015/0200150 A1* | 7/2015 | Kim | .................... H01L 23/3738 |
| | | | 257/713 |

* cited by examiner

*Primary Examiner* — Thao P Le
(74) *Attorney, Agent, or Firm* — Patterson + Sheridan, LLP

(57) ABSTRACT

A chip package assembly and method for fabricating the same are provided which incorporate phase change materials within the chip package assembly for improved thermal management. In one example, a chip package assembly is provided that includes a substrate, a first integrated circuit (IC) die stacked on the substrate, a dielectric filler layer, a cover and a phase change material. The phase change material is sealed within a recess formed between the first IC dies and the cover.

20 Claims, 6 Drawing Sheets

US 11,195,780 B1

STACKED SILICON PACKAGE ASSEMBLY HAVING THERMAL MANAGEMENT USING PHASE CHANGE MATERIAL

TECHNICAL FIELD

Embodiments of the present invention generally relate to a chip package assembly, and in particular, to a chip package assembly comprising at least one integrated circuit (IC) die disposed on a package substrate or interposer substrate, and a phase change material disposed between the IC die and a cover of the chip package assembly.

BACKGROUND

Electronic devices, such as tablets, computers, copiers, digital cameras, smart phones, control systems and automated teller machines, among others, often employ electronic components which leverage chip package assemblies for increased functionality and higher component density. Conventional chip packaging schemes often utilize a package substrate, often in conjunction with a through-silicon-via (TSV) interposer substrate, to enable a plurality of integrated circuit (IC) dies to be mounted to a single package substrate. The IC dies may include memory, logic or other IC devices.

In many chip package assemblies, providing adequate thermal management has become increasingly challenging. Failure to provide adequate cooling often results in diminished service life and even device failure. Thermal management is particularly problematic in applications where power dissipation requirements are in the high hundreds of Watts, as traditional polymeric thermal interface materials are limited by relatively low thermal conductivity. In such applications, even though indirect cooling techniques, such as chillers and the like, have the capacity to handle such high power dissipation requirements, heat transfer to the exterior of the chip package assembly remains a limiting factor. Thus, the risk of to thermal junction temperature limit of the chip package assembly being exceeded remains high, which could undesirably result in device failure or system shutdowns.

Therefore, a need exists for a chip package assembly having improved thermal management.

SUMMARY

A chip package assembly and method for fabricating the same are provided which incorporate phase change material within the chip package assembly for improved thermal management. In one example, a chip package assembly is provided that includes a substrate, a first integrated circuit (IC) die, a dielectric filler layer, a cover and a phase change material. The substrate has first surface coupled to a second surface by sides. The first IC die is stacked on the first surface of the substrate. The dielectric filler layer is disposed on the first surface of substrate and is in contact with the sides of the first IC die. The cover is disposed over the first surface of the first IC die, with the first IC die being disposed between the cover and the first surface of the substrate. The dielectric filler layer extends beyond the first surface of the first IC die to form a recess. The recess is laterally bounded by a portion of the dielectric filler layer extending beyond the first surface of the first IC die. The phase change material is disposed in the recess.

In another example, a chip package assembly is provided that includes a substrate, an integrated circuit (IC) die, a dielectric filler layer, a cover, a seal material, and a phase change material. The substrate has first surface and a second surface. The IC die is stacked on the first surface of the substrate. The IC die includes a first surface coupled to a second surface by sides. The dielectric filler layer is disposed on the first surface of substrate. The dielectric filler layer is in contact with the sides of the IC die and extends at least 20 µm beyond the first surface of the first IC die. The cover is disposed over the first surface of the IC die so that the IC die is disposed between the cover and the first surface of the substrate. A recess is defined between the cover and the first surface of the IC die. The recess laterally bounded by a portion of the dielectric filler layer extending beyond the first surface of the IC die. The seal material is disposed between the cover and the dielectric filler layer. The seal material seals the sides of the recess. The phase change material is disposed in the recess and has a composition different than the seal material.

In another example, a method of fabricating a chip package assembly is provided that includes disposing a phase change material in a recess defined above a surface of a first IC die laterally surrounded by a dielectric filler; and stacking a cover on a dielectric filler layer and sealing the phase change material in the recess.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package assembly and method for fabricating the same are provided which incorporate phase change material within the chip package assembly to remove heat rapidly and efficiently. The chip package assembly described herein includes at least one integrated circuit (IC) die disposed on a substrate. The substrate may be a package substrate or an interposer substrate. Phase change material is disposed within the chip package assembly between the top surface of the IC die and a cover of the chip package assembly. The phase change material provides a robust heat transfer path vertically away from the IC die to the cover. Once transferred to the cover, heat may be removed from the chip package assembly by any suitable device or technique, such as by a chiller interfaced with the cover. Advantageously, the rapid and efficient heat transfer path provided by the phase change material vertically out of the chip package assembly improves reliability and performance. Furthermore, the effectiveness of phase change material enables the use of high powered IC dies while mitigating thermal coupling and temperature rise within the chip package assembly, which advantageously improves performance and service lift of the chip package assembly.

Figure 1:
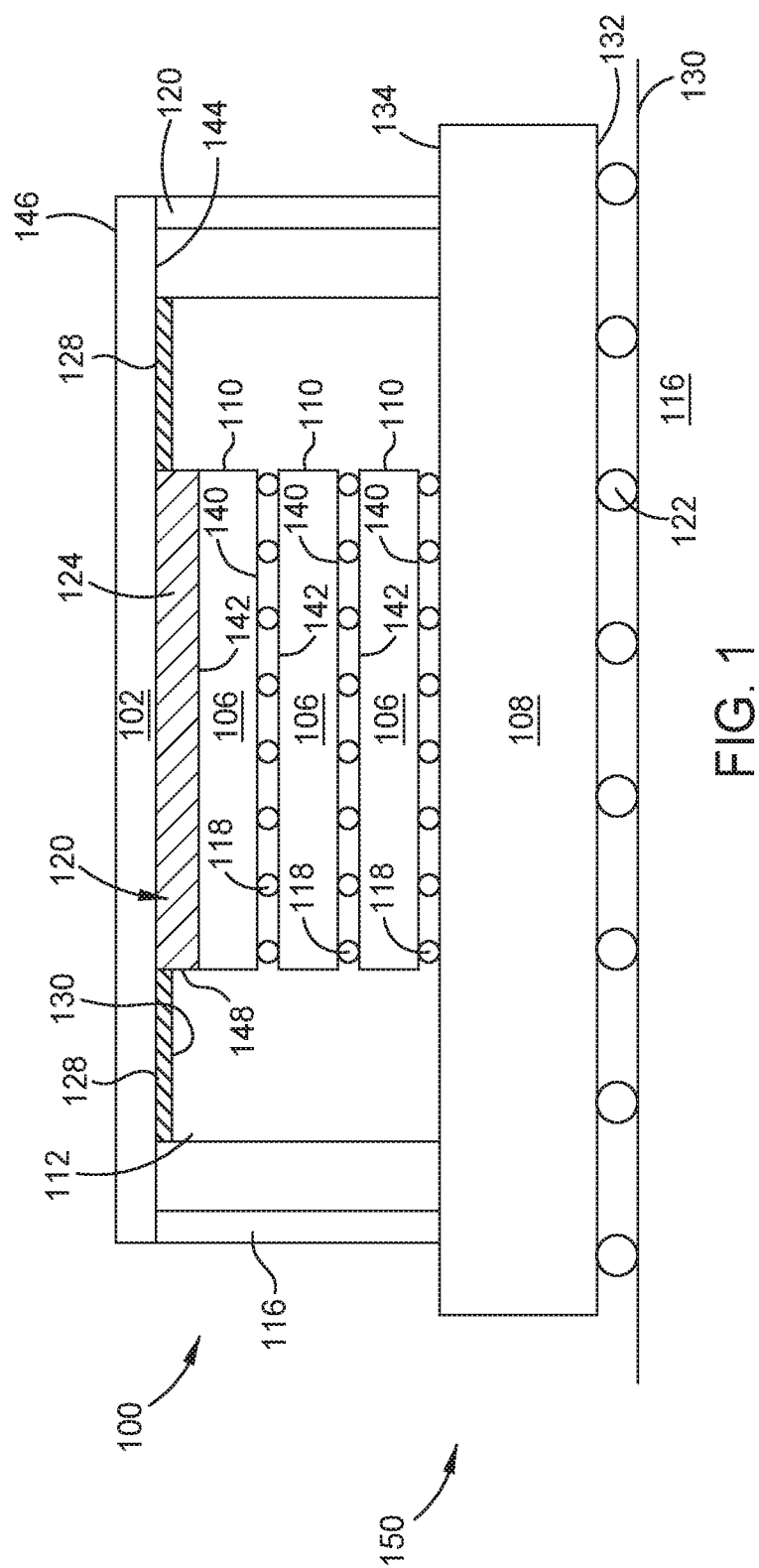
FIG. 1 is a schematic sectional view of a chip package assembly having a single IC die that incorporates phase change material to enhance thermal management.

Turning now to FIG. 1, a schematic sectional view of a chip package assembly 100 having phase change material 124 providing an efficient heat transfer path away from a plurality of integrated circuit (IC) dies 106 is illustrated. The chip package assembly 100 also includes a cover 102, dielectric filler 112 and a package substrate 108. Optionally, an interposer substrate (shown by reference numeral 104 in FIG. 2), may be utilized between the IC die 106 and the package substrate 108.

Figure 2:
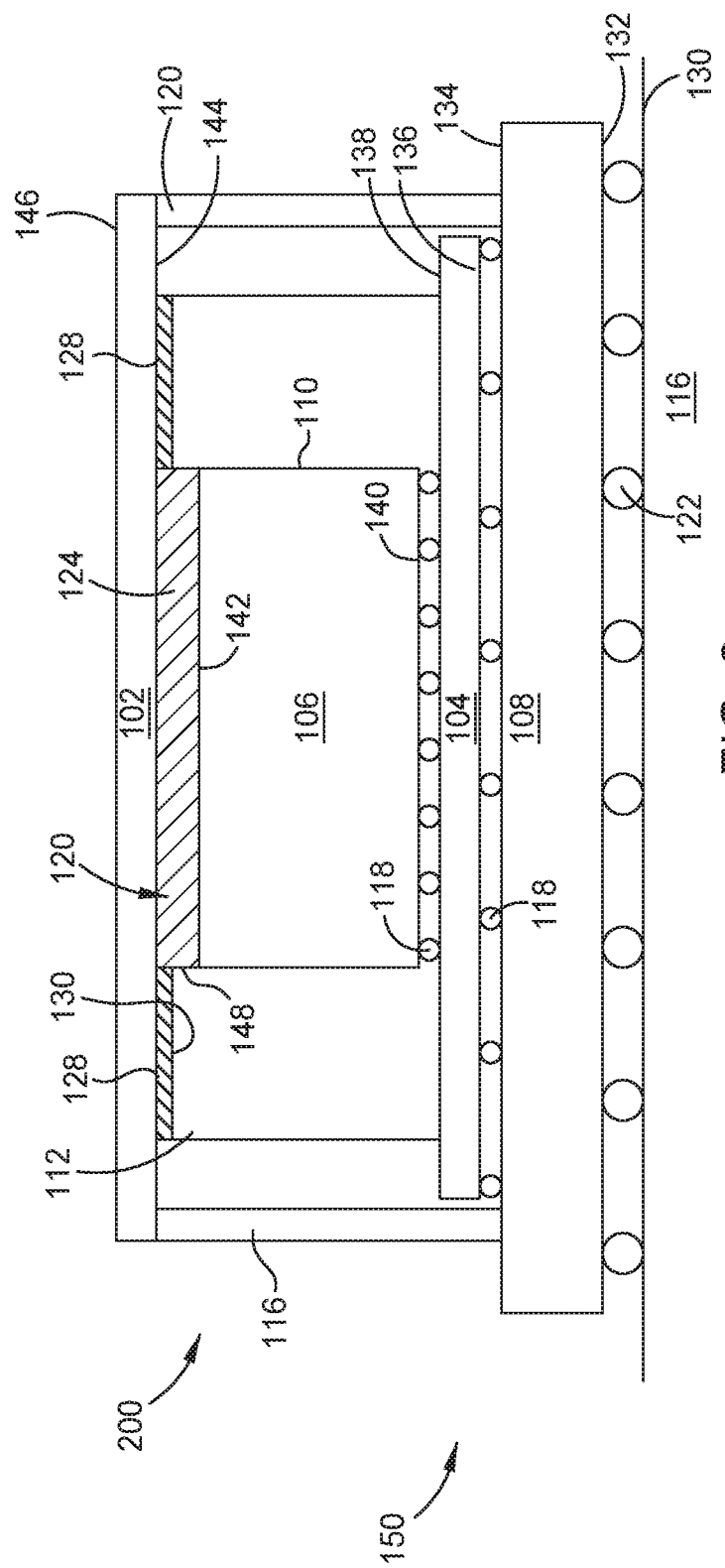
FIG. 2 is a schematic sectional view of another chip package assembly having a plurality of IC dies that incorporates phase change material to enhance thermal management.

Although a plurality of IC dies 106 are shown in FIG. 1, the total number of IC dies may range from one to as many as can be fit within the chip package assembly 100. For example, a chip package assembly 200 illustrated in FIG. 2 is fabricated identical to the chip package assembly 100 of FIG. 2 except that the chip package assembly 200 has a single IC die 106 disposed on the optional interposer substrate 104. Continuing to refer to FIG. 1, the IC dies 106 that may be utilized in the chip package assembly 100 include, but are not limited to, programmable logic devices, such as field programmable gate arrays (FPGA), memory devices, such as high band-width memory (HBM), optical devices, processors, application-specific integrated circuit (ASIC), or other solid state, logic or memory structures. One or more of the IC dies 106 may optionally include optical devices such as photo-detectors, lasers, optical sources, and the like.

In the example depicted in FIG. 1, the IC die 106 closest the cover 102 has a power consumption higher than the remaining dies 106 in the die stack shown disposed on the package substrate 108. For example, the IC die 106 closest the cover 102 may include a high power processor, such as a math engine, while the IC die 106 closest the package substrate 108 may be an I/O die, while one or more of the IC dies 106 disposed in the middle of the die stack comprise processor and/or memory circuitry.

Each IC die 106 includes a bottom surface 140 disposed opposite a top surface 142 that are connected by sides 110 of the die 106. The bottom and top surfaces 140, 142 do not necessarily represent the active and substrate sides of the IC dies 106. It is intended that the bottom surface 140 of one die 106 mounted to the top surface 142 of a second IC die 106 may result in the active sides of each die 106 facing the same direction, or facing opposite directions. For example, the active side of one die 106 may be directly mounted to the active side of the adjacent die 106. Although the example depicted in FIG. 1 illustrates a 3D die stack, any heterogeneous combination of dies (3D stacked or not) may be embodied by the chip package assembly 100.

The top surface 142 of the upper most IC die 106 faces the cover 102, while the bottom surface 140 of the upper most IC die 106 faces the top surface 142 of the lower most IC die 106. Contact pads exposed on the bottom surface 140 of the die 106 are coupled to contact pads exposed on the top surface 142 of the adjacent underlying IC die 106 by solder connections 118 or other suitable electrical connection, such as a hybrid connecter comprised of metal circuit connection material disposed in a dielectric sheet.

The top surface 142 of the upper most IC die 106 is adjacent to the cover 102, while the bottom surface 140 of the lower most IC die 106 is adjacent to the interposer substrate 104 in the embodiment of FIG. 2 or the package substrate 108 in the embodiment of FIG. 1. In the embodiment of FIG. 2, the bottom surface 140 of the lower most die 106 is electrically and mechanically coupled to a top surface 138 of the interposer substrate 104 by solder connections 118 or other suitable electrical connection. In the embodiment of FIG. 1, the bottom surface 140 of the lower most die 106 is electrically and mechanically coupled to a top surface 134 of the package substrate 108 by solder connections 118 or other suitable electrical connection.

The top surface 142 of the upper most die 106 faces a bottom surface 144 of the cover 102. The cover 102 is generally fabricated from rigid thermally conductive material. Materials suitable for use as the cover 102 include, but are not limited to, stainless steel, copper, nickel-plated copper or aluminum, among other suitable materials. A heat sink or other heat transfer device such as a chiller, not shown, may optionally be mounted to or interfaced with a top surface 146 of the cover 102.

The cover 102 may be structurally coupled to the package substrate 108 to increase the rigidity of the chip package assembly 100. Optionally, a stiffener 116 may be utilized to structurally couple the cover 102 to the package substrate 108. When used, the stiffener 116 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 116 can also be made of organic materials such as copper-clad laminate.

Functional circuitry of the IC dies 106 is connected to the circuitry of the package substrate 108 through the solder connections 118. The circuitry of the interposer substrate 104, when present, includes circuitry that connects the circuitry of the package substrate 108 to the functional circuitry of the IC dies 106. In the example depicted in FIG. 2, a bottom surface 136 of the interposer substrate is electrically and mechanically coupled to the top surface 134 of the package substrate 108 by solder connections 118 or other suitable connection.

The chip package assembly 100 may be mounted to a printed circuit board (PCB) 116 to form an electronic device 150. In this manner, the circuitry of the package substrate 108 is coupled to the circuitry of the package substrate 108 via solder balls 122, or other suitable connection. In the example depicted in FIG. 1, a bottom surface 132 of the package substrate 108 is electrically and mechanically coupled to a top surface 130 of the PCB by the solder balls 122.

The dielectric filler 112 is disposed on the package substrate 108 and at least partially laterally circumscribes the IC dies 106. The dielectric filler 112 provides additional rigidity to the chip package assembly 100, while also protecting the solder connections 118 between the IC dies 106. The dielectric filler 112 may be an epoxy-based material or other suitable material. The dielectric filler 112 may additionally include fillers, for example, inorganic fillers such as silica ($SiO_2$). In one example, the dielectric filler 112 may have a CTE between about 20 to about 40 ppm/degree Celsius, a viscosity of between about 5 to about 20 Pascal-seconds, and a Young's modulus of between about 6 to about 15 gigapascal (GPa).

In one example, the dielectric filler 112, prior to curing, has a viscosity suitable to flow into and fill the interstitial space between the bottom surface 140 of the IC dies 106 and the top surface 138 of the interposer substrate around the solder connections 118. Alternatively, a separate underfill material may be used to fill the interstitial space the bottom surface 140 of the IC dies 106 and the top surface 138 of the interposer substrate 104 around the solder connections 118, while the dielectric filler 112 is disposed over the underfill and fills the interstitial space between adjacent dies 106. Alternatively, the solder connections 118 disposed between the bottom surface 140 of the IC dies 106 and the top surface 138 of the interposer substrate 104 or between the bottom surface 140 of the IC dies 106 and the top surface 134 of the package substrate 108 may include a redistribution layer (RDL).

The dielectric filler 112 is in contact with the package substrate 108 and the sides 110 of the IC dies 106. A portion 148 of the dielectric filler 112 also extends beyond the sides 110 and the top surface 142 of the IC die 106 that is closest the cover 102. The portion 148 of the dielectric filler 112 extending beyond the sides 110 of the upper most IC die 106 laterally bound a recess 120. In one example, the dielectric filler 112 extends beyond the top surface 142 of the upper most IC die 106 by least 20 μm, for example by least 50 μm or even up to at least 75 μm. The depth of the recess 120 provides ample space for the phase change material 124 to change phases at the top and bottom of the recess 120 to take advantage of the high latent heat capacity provided by the phase changes. The recess 120 is bound on the top and bottom by the cover 102 and the top surface 142 of the IC die 106. The sides of recess 120 are sealed by seal material 128 that is disposed between a top surface 130 of the dielectric filler 112 and the bottom surface 144 of the cover 102 and encircles the recess 120. The seal material 128 may be a thermal interface material (TIM), epoxy, adhesive or other suitable materially. The seal material 128 may also include a conductive filler. The seal material 128 has a material composition different than the material composition of the phase change material 124. Generally, the seal material 128 has a much lower heat transfer capacity as compared to the phase change material 124. Since the seal material 128 does not have to be a TIM composition to enjoy the robust heat transfer provided by the phase change material 124, the seal material 128 when employed as an adhesive significantly adds to the robust rigidity and resistance to warpage of the chip package assembly 100.

The phase change material 124 is generally selected to have phase change temperature that is approximately between 70 and 100 percent less than a rated maximum operating temperature in degrees Kelvin of the chip package assembly 100. The phase change temperature, also referred to as the target temperature, may be a freezing point, a boiling point or a triple point. In one example, the phase change material 124 selected to change from a solid phase to a liquid phase at a target temperature of the phase change material 124 when the IC die 106 is slightly below a maximum operating temperature. In another example, the phase change material 124 may be selected so that at least a portion the phase change material 124 will be in the solid or liquid phase when the IC die 106 is rising in temperature in the temperature range defined between the lowest operating temperature of the IC die 106 and below the maximum operating temperature of the IC die 106. In another example, the phase change material 124 may be selected to be in either the solid phase or in a mixed phase of solid and liquid when a temperature of the IC die 106 is rising but below the maximum operating temperature of the IC die 106. In another example, the phase change material 124 may be selected to be in either the liquid phase or in a mixed phase of gaseous and liquid when a temperature of the IC die 106 is rising but below the maximum operating temperature of the IC die 106. Having a mixed phase of phase change material 124 near the maximum operating temperature of the IC die 106 ensures that the latent heat of the phase change material 124 slows the temperature rise of the IC die 106 as the is heated close to its maximum operating temperature. In yet another example, the phase change material 124 may be selected to be in a mixed phase of solid and liquid when a temperature of the IC die 106 is in the range of above the target temperature of the phase change material 124 and the maximum operating temperature of the IC die. For example, the phase change material 124 may be predominantly in a liquid or gaseous phase when a temperature of the IC die 106 is at the maximum operating temperature of the IC die 106. In other examples, the target temperature of the phase change material 124 may be within about 80% or higher of the maximum operating absolute temperature of the IC die 106.

In another example, the phase change material 124 comprise a low-melting point metal, such gallium, gallium-based compound and other suitable compounds having a phase change temperature that is close to but below the rated maximum operating temperature of the chip package assembly 100. In one example, the rated maximum operating temperature of the chip package assembly 100 is about 125 degrees Celsius. The low-melting point metal may be the form of an alloy. In one example, the phase change material 124 is a liquid at ambient temperature and comprises gallium. The gallium may be in alloyed form or mixed with another liquid. The phase change material 124 has a composition comprising gallium and indium, and optionally includes one or both of tin and zinc, with gallium comprising at least 60 percent by weight of the composition. The phase change material 124 may alternatively comprise other suitable materials, such as but not limited to eutectic materials, water, paraffins, fatty acids, and suitable inorganic materials such as metallic, salts and hydrates. In some examples, the phase change material 124 is selected from a material having a phase change point temperature of about 343-373 degrees Kelvin.

As the phase change material 124 is sealed within the recess 120 by the seal material 128, the phase change material 124, when in a liquid or gaseous state, is prevented from escaping the recess 120. Since the phase change material 124 remains captured and confined in the recess 120 even while in liquid and gaseous states, the amount and consequently effectiveness of the phase change material 124 providing a robust heat transfer path between the top surface 142 of the IC die 106 and the cover 102 does not diminish over time. Moreover, the liquid and gaseous states of the phase change material 124 essentially removes interfacial heat transfer resistance between the IC die 106 and the cover 102, enabling the use of higher power IC dies 106 within the chip package assembly 100 without correspondingly increasing the size and cost of external heat transfer devices (i.e., a chiller).

Figure 3:
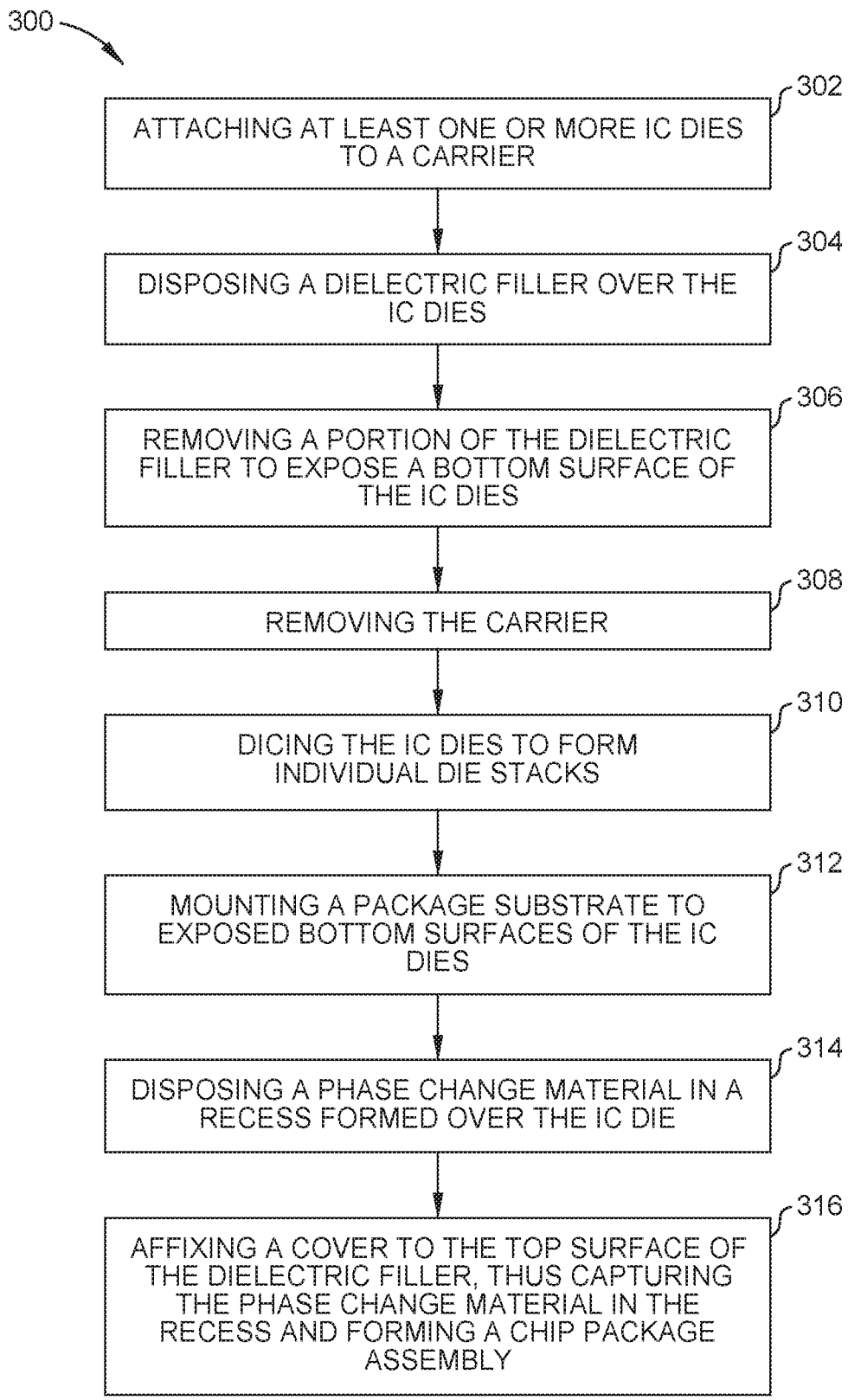
FIG. 3 is flow diagram of a method for forming a chip package assembly that incorporates phase change material to enhance thermal management.

FIG. 3 is flow diagram of a method 300 for forming a chip package assembly, such as the chip package assembly 100 described above, that incorporates phase change material 124 to enhance thermal management. It is contemplated that the method 300 may also be utilized to form other chip package assemblies, including the assembly 200 illustrated in FIG. 2. The method 300 of FIG. 3 is described below with reference to FIGS. 4A-4H, which schematic side views of the chip package assembly 100 during different stages of fabrication.

Figure 4A:
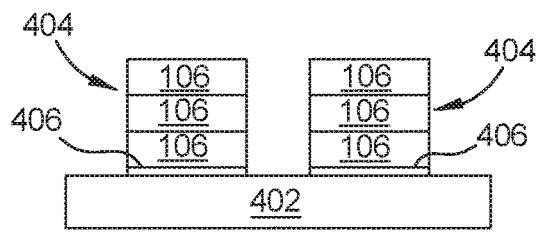
FIGS. 4A-4H are schematic side views of a chip package assembly during different stages of fabrication in accordance with the method illustrated in FIG. 3.

The method 300 begins at operation 302 by attaching at least one die 106 to a carrier 402, as shown in FIG. 4A. In the example depicted in FIG. 4A, a plurality of IC dies 106 previously assembled into a die stack 404 are attached to the carrier 402 utilizing die attach film (DAF) 406. The IC dies 106 may be thinned prior to attaching to the carrier 402.

Figure 4B:
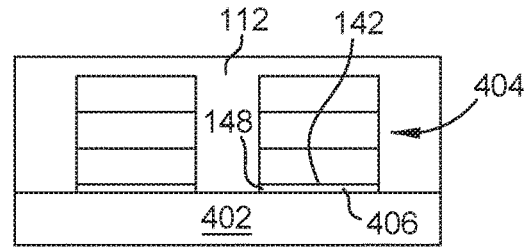

At operation 304, a dielectric filler 112 is disposed over the IC dies 106, as shown in FIG. 4B. The dielectric filler 112 generally encapsulates the IC dies 106 disposed on the carrier 402. The thickness of the die attach film 406 spaces a top surface 142 of the IC die 106 from the carrier 402, such that a portion 148 of the dielectric filler 112 extends beyond the top surface 142 of the IC die 106 by least 20 μm.

Figure 4C:
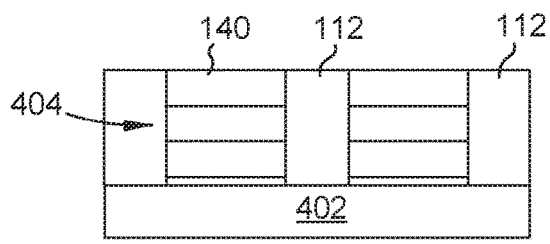
Figure 4D:
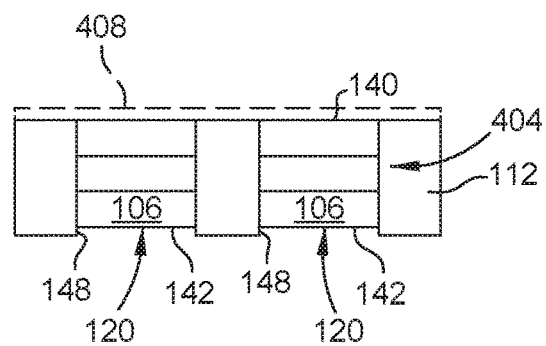

At operation 306, a portion of the dielectric filler 112 is ground down or otherwise removed to expose a bottom surface 140 of the bottom most IC dies 106 of the die stacks 404, as shown in FIG. 4C. At operation 308, the carrier 402 is removed, as shown in FIG. 4D. When the carrier 402 is removed (i.e., debonded), the portion 148 of the dielectric filler 112 remains extending beyond the top surface 142 of the IC die 106 thereby forming a recess 120. The depth of the recess 120 is predominantly controlled by the thickness of the die attach film 406. Optionally at operation 308, a redistribution layer (RDL) 408, shown in phantom, may be formed on the bottom surfaces 140 of the IC dies 106 for later attachment of the dies 106 to an interposer substrate or package substrate.

Figure 4E:
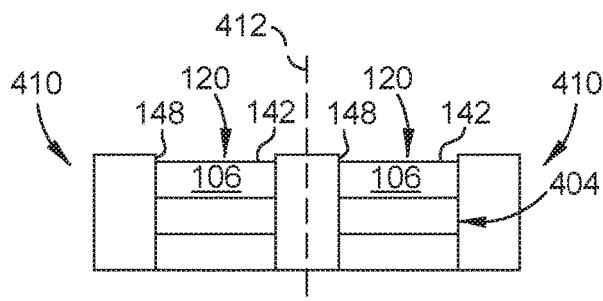
Figure 4F:
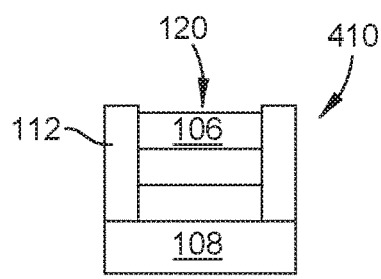

At operation 310, the IC dies 106 are diced to form individual diced die stacks 410, as shown in FIG. 4E. For example, the IC dies 106 may be separated along a scribe lane 412 (shown in phantom). At operation 312, the IC dies 106 of the individual diced die stacks 410 are mounted to the package substrate 108, as shown in FIG. 4F. The package substrate 108 is mounted IC dies 106 in a manner that enables the electrical connection of the circuitry of the package substrate 108 to the circuitry of the IC dies 106. The IC dies 106 may be mounted to the package substrate 108 via solder or solderless connections, or utilizing a redistribution layer (RDL) 408 as shown in FIG. 4D. Optionally, an underfill may be disposed between the package substrate 108 and the IC dies 106 to protect the electrical connections and increase the rigidity of the substrate to die interface.

Figure 4G:
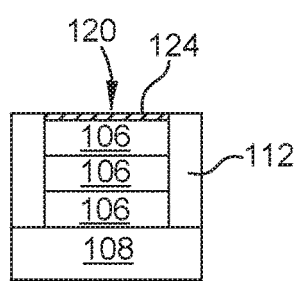
Figure 4H:
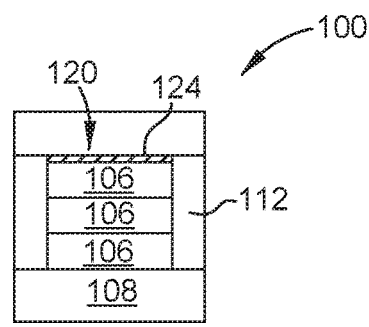

At operation 314, a phase change material 124 is disposed in the recess 120, as shown in FIG. 4G. At operation 316, a cover 102 is affixed to the top surface of the dielectric filler 112, thus capturing the phase change material 124 in the recess 120 and forming the chip package assembly 100, as shown by FIG. 4H. The phase change material 124 is sealed in the recess 120 by a seal material 128 that adheres the cover 102 to the top surface of the dielectric filler 112.

Figure 5:
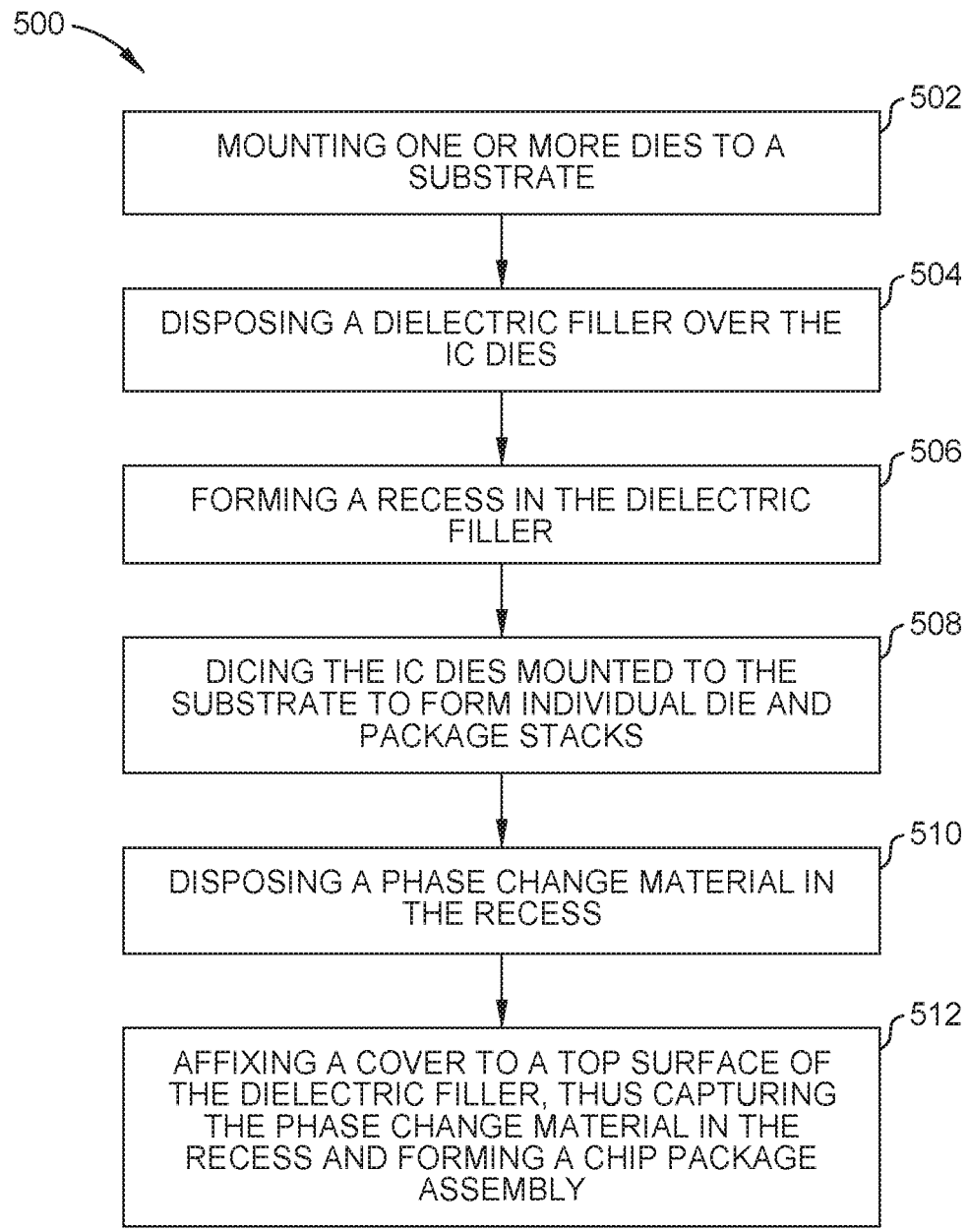
FIG. 5 is flow diagram of another method for forming a chip package assembly that incorporates phase change material to enhance thermal management.

FIG. 5 is flow diagram of another method 500 for forming a chip package assembly, such as the chip package assembly 100 described above, that incorporates phase change material 124 to enhance thermal management. It is contemplated that the method 500 may also be utilized to form other chip package assemblies, including the assembly 200 illustrated in FIG. 2. The method 500 of FIG. 5 is described below with reference to FIGS. 6A-6F, which schematic side views of the chip package assembly 100 during different stages of fabrication.

The method 500 begins at operation 502 by mounting at least one die 106 to a substrate, such as a package substrate or interposer substrate. In the example depicted in FIG. 6A, two IC dies 106 are mounted to a package substrate 108. The IC dies 106 may be mounted to the package substrate 108 via solder or solderless connections, or utilizing a redistribution layer (RDL). In the example depicted in FIG. 6A, the IC dies 106 where previously assembled into die stacks 604 prior to being attached to the package substrate 108. The IC dies 106 may be thinned prior to mounting to the package substrate 108.

Figure 6A:
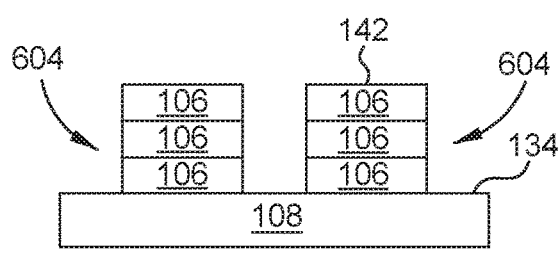
FIGS. 6A-6F are schematic side views of a chip package assembly during different stages of fabrication in accordance with the method illustrated in FIG. 5.
Figure 6B:
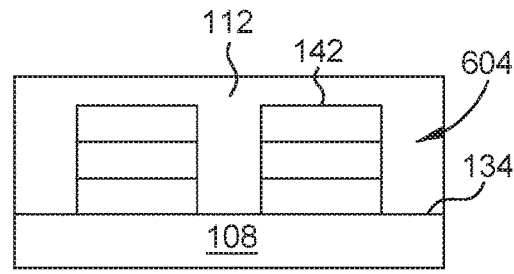

At operation 504, a dielectric filler 112 is disposed over the IC dies 106, as shown in FIG. 6B. The dielectric filler 112 generally encapsulates the IC dies 106 disposed on the package substrate 108.

Figure 6C:
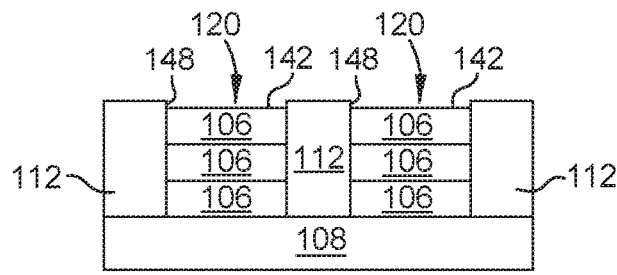

At operation 506, a recess 120 is formed in the dielectric filler 112, as shown in FIG. 6C. The recess 120 is laterally bounded by portions of the dielectric filler 112 that extend beyond the top surface 142 of the uppermost IC die 106. A bottom of the recess 120 is defined by the top surface 142 of the uppermost IC die 106. The recess 120 may be formed by etching, mechanical material removal (such as grinding, abrasive blasting, milling, and the like), by protrusion in the mold cavity, or by another suitable technique. Optionally, the recess 120 may be formed simultaneously with operation 504 by embossing the dielectric filler 112, by molding the recess 120 as part of the dielectric filler 112 deposition, or other suitable technique.

Figure 6D:
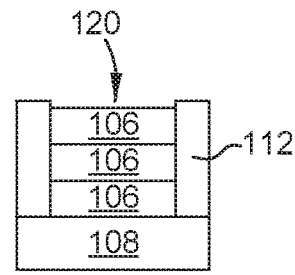
Figure 6E:
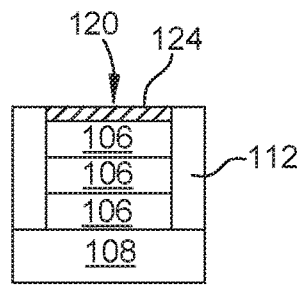

At operation 508, the IC dies 106 mounted to the package substrate 108 are diced to form individual die and package stacks 610, as shown in FIG. 6D. At operation 510, a phase change material 124 is disposed in the recess 120, as shown in FIG. 6E.

Figure 6F:
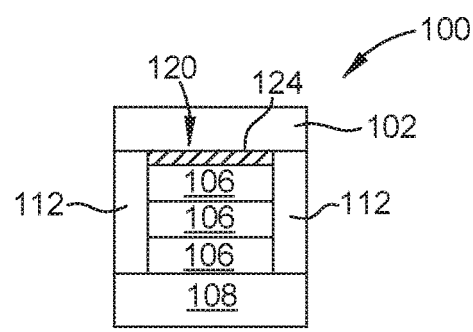

At operation 512, a cover 102 is affixed to the top surface of the dielectric filler 112, thus capturing the phase change material 124 in the recess 120 and forming the chip package assembly 100, as shown by FIG. 6F. The phase change material 124 is sealed in the recess 120 by a seal material 128 that adheres the cover 102 to the top surface of the dielectric filler 112.

Thus, a chip package assembly and method for fabricating the same are described which utilize a phase change material to improve heat transfer vertically away from integrated circuit (IC) dies comprising the chip package assembly. The phase change material, particularly when utilized across a liquid/gas phase change state, advantageously provide a robust conductive heat transfer path that has very small thermal interface resistance as compared to traditional thermal interface materials. Significantly, the high latent heat capacity and rapid response of the phase change material enables reliable use of high powered IC dies within the chip package assembly, thus advantageously reducing thermal coupling and temperature rise, and consequently improving performance and service life of the chip package assembly and the electronic devices incorporating the same.

In addition to the claims described below, the technology described above may also be illustrated by one or more of the following non-limiting examples:

Example 1. A method for forming a chip package assembly, the method comprising:
    mounting one or more IC dies to a substrate;
    disposing a dielectric filler is disposed over the IC dies;
    forming a recess is formed in the dielectric filler;
    dicing the IC dies mounted to the substrate to form individual die and package stacks;
    disposing a phase change material is disposed in the recess; and affixing a cover to a top surface of the dielectric filler, thus capturing the phase change material in the recess and forming the chip package assembly.

Example 2. The method of Examiner 1, wherein disposing a phase change material is disposed in the recess further comprises:
disposing a material comprising at least one of gallium, indium or tin in the recess.

Example 3. The method of Examiner 1, wherein disposing a phase change material is disposed in the recess further comprises:
disposing a gallium containing material in the recess.

Example 4. The method of Examiner 1, wherein disposing a phase change material is disposed in the recess further comprises:
disposing a liquid gallium containing material in the recess.

Example 5. The method of Examiner 1, wherein disposing a phase change material is disposed in the recess further comprises:
disposing a liquid phase change material in the recess.

While the foregoing is directed to embodiments of the present invention, other and further embodiments of the invention may be devised without departing from the basic scope thereof, and the scope thereof is determined by the claims that follow.

What is claimed is:

1. A chip package assembly comprising:
a substrate having first surface and a second surface;
a first integrated circuit (IC) die stacked on the first surface of the substrate, the first IC die having a first surface coupled to a second surface by sides;
a dielectric filler layer disposed on the first surface of the substrate, the dielectric filler layer in contact with the sides of the first IC die and extending beyond the first surface of the first IC die;
a cover disposed over the first surface of the first IC die, the first IC die disposed between the cover and the first surface of the substrate;
a recess defined between the cover and the first surface of the first IC die, the recess laterally bounded by a portion of the dielectric filler layer extending beyond the first surface of the first IC die; and
a phase change material disposed in the recess.

2. The chip package assembly of claim 1, wherein the phase change material is a material having phase transition temperature that is approximately between 70 and 100 percent less than a rated maximum operating temperature in degrees Kelvin of the chip package assembly.

3. The chip package assembly of claim 1, wherein the phase change material is a gallium containing material.

4. The chip package assembly of claim 1 comprising:
a seal material disposed between the dielectric filler layer and the cover, the seal material sealing the recess.

5. The chip package assembly of claim 4, wherein the seal material has a composition different than the phase change material.

6. The chip package assembly of claim 5, wherein the seal material comprises:
a thermal interface material, an adhesive, or an adhesive having a conductive filler.

7. The chip package assembly of claim 1, wherein the second surface of the first IC die electrically and mechanically mounted to the first surface of the substrate.

8. The chip package assembly of claim 1 further comprising:
a second IC die electrically and mechanically mounted to the first surface of the substrate, the second IC die disposed between the first IC die and the first surface of the substrate, the dielectric filler layer disposed in contact with sides of the second IC die.

9. A chip package assembly comprising:
a substrate having first surface and a second surface;
an integrated circuit (IC) die stacked on the first surface of the substrate, the IC die having a first surface coupled to a second surface by sides;
a dielectric filler layer disposed on the first surface of the substrate, the dielectric filler layer in contact with the sides of the IC die and extending at least 20 μm beyond the first surface of the first IC die;
a cover disposed over the first surface of the IC die, the IC die disposed between the cover and the first surface of the substrate;
a recess defined between the cover and the first surface of the IC die, the recess laterally bounded by a portion of the dielectric filler layer extending beyond the first surface of the IC die;
a seal material disposed between the cover and the dielectric filler layer, the seal material sealing the recess; and
a phase change material disposed in the recess, the phase change material having a composition different than the seal material.

10. The chip package assembly of claim 9, wherein the phase change material is a gallium containing material.

11. The chip package assembly of claim 9, wherein the seal material comprises an adhesive having a conductive filler.

12. The chip package assembly of claim 9, wherein the recess has a depth of between 20 to 60 μm.

13. The chip package assembly of claim 9, wherein the phase change material is a material having phase transition temperature less than a maximum safe operating temperature of the IC die.

14. A method of fabricating a chip package assembly, the method comprising:
disposing a phase change material in a recess defined above a surface of a first IC die laterally surrounded by a dielectric filler; and
stacking a cover on a dielectric filler layer and sealing the phase change material in the recess.

15. The method of claim 14 further comprising:
molding the dielectric filler layer around the first IC die;
removing a portion of the dielectric filler layer to expose electrical contacts of the IC die; and
forming a redistribution layer on the exposed contact of the first IC die.

16. The method of claim 14 further comprising:
removing a die attach film (DAF) from the first IC die leaving the dielectric filler layer extending least 20 μm beyond the surface of the first IC die.

17. The method of claim 14, wherein sealing the phase change material in the recess further comprises:
sealing the dielectric filler layer to the cover with a seal material that has a composition different than that of the phase change material.

18. The method of claim 14 further comprising:
stacking a second IC die on the first IC die.

19. The method of claim 14 further comprising:
separating the first IC die from a second IC die disposed in the dielectric filler layer.

20. The method of claim 14 further comprising:
molding the dielectric filler layer around the IC die after mounting the first IC die to a substrate.

* * * * *